(12) United States Patent
Matsumaru (10) Patent No.: US 11,211,696 B2
(45) Date of Patent: Dec. 28, 2021

(54) WIRELESS COMMUNICATION MODULE

(71) Applicant: FUJIKURA LTD., Tokyo (JP)

(72) Inventor: Kohei Matsumaru, Sakura (JP)

(73) Assignee: FUJIKURA LTD., Tokyo (JP)

( * ) Notice: Subject to any disclaimer, the term of this patent is extended or adjusted under 35 U.S.C. 154(b) by 73 days.

(21) Appl. No.: 16/638,917

(22) PCT Filed: May 31, 2018

(86) PCT No.: PCT/JP2018/020877
§ 371 (c)(1),
(2) Date: Feb. 13, 2020

(87) PCT Pub. No.: WO2019/058646
PCT Pub. Date: Mar. 28, 2019

(65) Prior Publication Data
US 2020/0365977 A1    Nov. 19, 2020

(30) Foreign Application Priority Data

Sep. 22, 2017   (JP) .............................. JP2017-182770

(51) Int. Cl.
*H01Q 1/38* (2006.01)
*H01Q 1/24* (2006.01)
(Continued)

(52) U.S. Cl.
CPC ............... *H01Q 1/38* (2013.01); *H01Q 1/243* (2013.01); *H01Q 23/00* (2013.01); *H04B 3/52* (2013.01)

(58) Field of Classification Search
CPC ........... H01G 1/38; H01G 1/243; H01G 23/00
See application file for complete search history.

(56) References Cited

U.S. PATENT DOCUMENTS 8,061,012 B2    11/2011   Carey et al.
2005/0030231 A1   2/2005   Nagaishi et al.
(Continued)

FOREIGN PATENT DOCUMENTS

FR          2710195 A1      3/1995
JP        11-136024 A       5/1999
(Continued)

OTHER PUBLICATIONS

Written Opinion dated Aug. 14, 2018, issued in counterpart Application No. PCT/JP2018/020877, with English Translation. (9 pages).
(Continued)

*Primary Examiner* — Graham P Smith
(74) *Attorney, Agent, or Firm* — Westerman, Hattori, Daniels & Adrian, LLP (57) ABSTRACT

To provide a wireless communication module capable of preventing radiation characteristics from being changed by deformation of an antenna circuit board, a wireless communication module includes an antenna circuit board having a first principal surface on which at least one antenna element is mounted and a second principal surface on which an integrated circuit is mounted. The wireless communication module includes a support that holds the antenna circuit board by being in contact with a pair of opposite sides thereof and that thereby keeps the antenna circuit board flat. The support either (i) faces the second principal surface and is separated from the second principal surface by a distance that is not smaller than the wavelength of an electromagnetic wave transmitted and received with use of the antenna circuit board or (ii) does not face the second principal surface.

11 Claims, 7 Drawing Sheets

(51) Int. Cl.
*H01Q 23/00* (2006.01)
*H04B 3/52* (2006.01)

(56) References Cited

U.S. PATENT DOCUMENTS

| | | | |
|---|---|---|---|
| 2005/0088260 A1 | 4/2005 | Ajioka et al. | |
| 2010/0164783 A1 | 7/2010 | Choudhury et al. | |
| 2015/0214598 A1* | 7/2015 | Fujita | H01Q 1/02 |
| | | | 343/702 |
| 2017/0250120 A1 | 8/2017 | Harauchi et al. | |

FOREIGN PATENT DOCUMENTS

| | | |
|---|---|---|
| JP | 2001-068576 A | 3/2001 |
| JP | 2002-76720 A | 3/2002 |
| JP | 2002-329833 A | 11/2002 |
| JP | 2003-500832 A | 1/2003 |
| JP | 2003-133801 A | 5/2003 |
| JP | 2003-188626 A | 7/2003 |
| JP | 2004-48489 A | 2/2004 |
| JP | 2004-140632 A | 5/2004 |
| JP | 2005-86603 A | 3/2005 |
| JP | 2008-244581 A | 10/2008 |
| JP | 2008-252303 A | 10/2008 |
| JP | 2012-514431 A | 6/2012 |
| WO | 2014196144 A1 | 12/2014 |
| WO | 2016/031807 A1 | 3/2016 |

OTHER PUBLICATIONS

International Search Report dated Aug. 14, 2018, issued in Application No. PCT/JP2018/020877 (2 pages).

* cited by examiner

WIRELESS COMMUNICATION MODULE

TECHNICAL FIELD

The present invention relates to a wireless communication module.

BACKGROUND ART

There has been known a wireless communication module including an antenna circuit board on which an antenna element, a feed line, and an integrated circuit are mounted. Patent Literature 1, for example, discloses in FIGS. 1 and 2 a module-integrated antenna including a multilayer substrate on which antennas, feed terminals, a first RFIC, and a second RFIC are mounted.

The module-integrated antenna, multilayer substrate, and antennas disclosed in Patent Literature 1 correspond respectively to the wireless communication module, antenna circuit board, and antenna elements described in the present specification. The first RFIC and second RFIC of the wireless communication module disclosed in Patent Literature 1 correspond to the integrated circuit described in the present specification. The first RFIC and the second RFIC are each connected to feed terminals via lines corresponding to the feed lines described in the present specification. The member names used in Patent Literature 1 are hereinafter each replaced with the corresponding one used in the present specification.

CITATION LIST

Patent Literature

[Patent Literature 1]
Japanese Patent Application Publication, Tokukai, No. 2003-188626

SUMMARY OF INVENTION

Technical Problem

As a result of an increase in network traffic in recent years, wireless communication modules such as the above transmit and receive an electromagnetic wave having a band with an increasingly higher frequency. The band called E band, for example, has a frequency of not less than 70 GHz and not more than 80 GHz. In such a high-frequency band, electric power fed from an integrated circuit to an antenna element via a feed line is known to suffer from a loss that depends on the dielectric material of which the antenna circuit board is made. A conventional wireless communication module (wireless communication module disclosed in FIGS. 1 and 2 of Patent Literature 1) uses, for example, ceramics as a material of which the antenna circuit board is made. In a case where such an antenna circuit board is used in a high-frequency band, a dielectric loss caused by the ceramics cannot be ignored. An antenna circuit board made of ceramics is also inflexible and problematically has poor processability.

Thus, as an antenna circuit board for use in a high-frequency region, a flexible antenna circuit board is widely used that includes, for example, a polyimide resin or liquid crystal polymer each having only a small dielectric loss. A conventional wireless communication module including such an antenna circuit board, however, involves an issue of antenna elements having unstable radiation characteristics. This is because each instance of deformation (for example, bending) of the antenna circuit board changes the radiation characteristics of the antenna elements.

The above-described deformation of the antenna circuit board increases with, for example, an increase in the amount of heat generated by an integrated circuit. In other words, the radiation characteristics of antenna elements become more instable with, for example, an increase in the amount of heat generated by an integrated circuit. This is because a flexible material such as a polyimide resin and liquid crystal polymer becomes softer and more easily deformable with a rise in the temperature of the material. The amount of heat generated by an integrated circuit tends to increase with a higher frequency of the band of an electromagnetic wave transmitted and received with use of the integrated circuit. This means that the above issue of antenna elements having instable radiation characteristics is more significant with a higher frequency of the band of an electromagnetic wave transmitted and received with use of an integrated circuit.

The present invention has been accomplished in view of the above issue. It is an object of the present invention to provide a wireless communication module capable of preventing radiation characteristics from being changed by deformation of an antenna circuit board.

Solution to Problem

In order to attain the above object, a wireless communication module in accordance with an aspect of the present invention includes: an antenna circuit board having (i) a first principal surface on which at least one antenna element is provided and (ii) a second principal surface on which at least one feed line and an integrated circuit are provided, which integrated circuit is connected to the at least one antenna element via the at least one feed line; and a support that holds a pair of opposite sides of the antenna circuit board so as to keep the antenna circuit board flat, the support being provided (i) so as to face the second principal surface of the antenna circuit board and so as to be away from the second principal surface of the antenna circuit board by a distance that is not smaller than a wavelength of an electromagnetic wave which is transmitted and received with use of the antenna circuit board or (ii) so as not to face the second principal surface of the antenna circuit board.

Advantageous Effects of Invention

An aspect of the present invention provides a wireless communication module capable of preventing radiation characteristics from being changed by deformation of an antenna circuit board.

BRIEF DESCRIPTION OF DRAWINGS (a) of FIG. 1 is a plan view of a wireless communication module in accordance with Embodiment 1 of the present invention. (b) of FIG. 1 is a cross-sectional view of the wireless communication module illustrated in (a) of FIG. 1 taken along line AA'.

(a) of FIG. 2 is a plan view of an antenna circuit board included in the wireless communication module illustrated in FIG. 1 on the side of the front surface of the antenna circuit board. (b) of FIG. 2 is a plan view of the antenna circuit board illustrated in (a) of FIG. 2 on the side of the back surface of the antenna circuit board.

(a) of FIG. 3 is a plan view of a wireless communication module in accordance with Variation 1 of the present invention. (b) of FIG. 3 is a cross-sectional view of the wireless communication module illustrated in (a) of FIG. 3 taken along line AA'.

(a) of FIG. 4 is a plan view of an antenna circuit board included in the wireless communication module illustrated in FIG. 3 on the side of the front surface of the antenna circuit board. (b) of FIG. 4 is a plan view of the antenna circuit board illustrated in (a) of FIG. 4 on the side of the back surface of the antenna circuit board.

(a) of FIG. 5 is a plan view of a wireless communication module in accordance with Variation 2 of the present invention. (b) of FIG. 5 is a cross-sectional view of the wireless communication module illustrated in (a) of FIG. 5 taken along line AA'.

(a) of FIG. 6 is a trihedral drawing of a wireless communication module in accordance with Embodiment 2 of the present invention. (b) of FIG. 6 is a plan view of the wireless communication module illustrated in (a) of FIG. 6 on the side of the back surface of the wireless communication module.

(a) of FIG. 7 is a trihedral drawing of a wireless communication module in accordance with Variation 3 of the present invention. (b) of FIG. 7 is a plan view of the wireless communication module illustrated in (a) of FIG. 7 on the side of the back surface of the wireless communication module.

DESCRIPTION OF EMBODIMENTS

Embodiment 1

Figure 1:
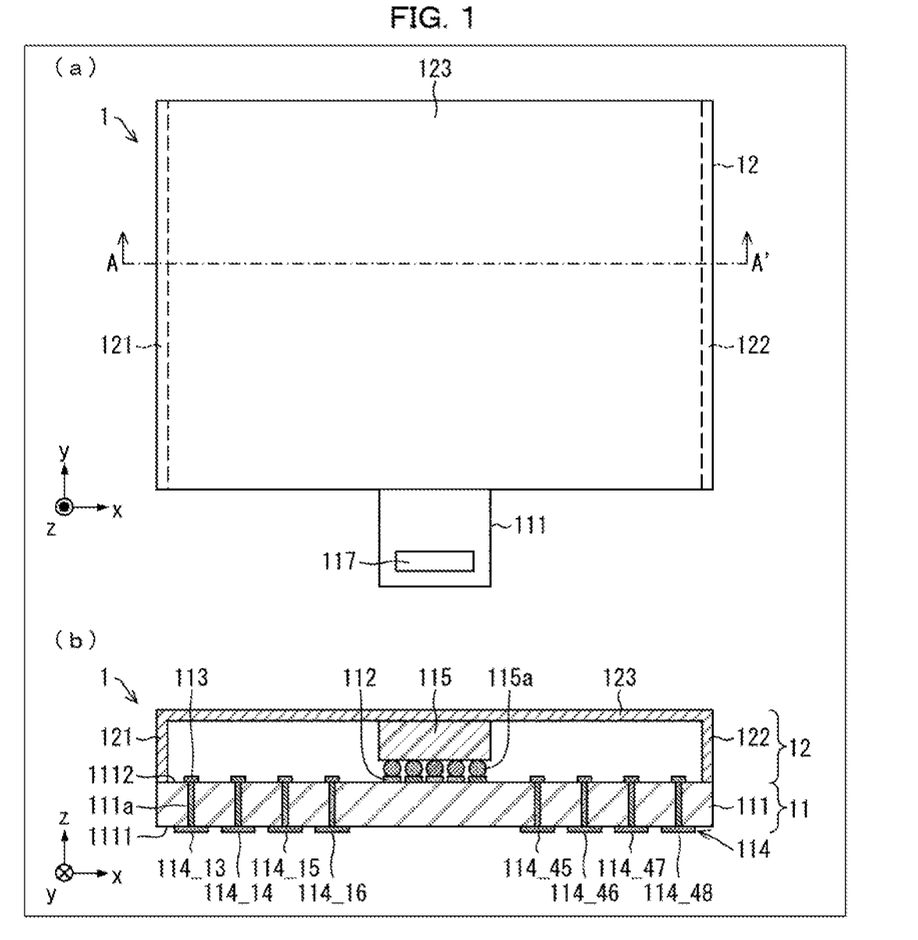

The following description will discuss Embodiment 1 of the present invention in detail with reference to FIGS. 1 and 2. (a) of FIG. 1 is a plan view of a wireless communication module 1 in accordance with Embodiment 1 of the present invention. (b) of FIG. 1 is a cross-sectional view of the wireless communication module 1, the cross section (i) being taken along straight line AA' shown in (a) of FIG. 1 and (ii) extending in a direction orthogonal to principal surfaces 1111 and 1112 of an antenna circuit board 11 described later.

As illustrated in (a) and (b) of FIG. 1, the wireless communication module 1 includes an antenna circuit board 11 and a support 12. The coordinate system in each of FIGS. 1 and 2 has (i) a z-axis direction parallel to a line normal to the principal surfaces 1111 and 1112 of the antenna circuit board 11, (ii) an x-axis direction along the long sides of each of the principal surfaces 1111 and 1112 of the antenna circuit board 11, and (iii) a y-axis direction along the short sides of each of the principal surfaces 1111 and 1112 of the antenna circuit board 11. The coordinate system has a z-axis positive direction in a direction extending from the principal surface 1111 to the principal surface 1112, the principal surface 1111 being that one of the two principal surfaces 1111 and 1112 of the antenna circuit board 11 on which one an antenna element group 114 is provided, the principal surface 1112 being that other one of the two principal surfaces 1111 and 1112 on which other one a power feed line group 113 is provided. The coordinate system has a y-axis positive direction in a direction extending from (i) that one of the pair of long sides of each of the principal surfaces 1111 and 1112 of the antenna circuit board which is near a connector 117 to (ii) the other one of the long sides. The coordinate system has an x-axis positive direction that allows a right-handed rectangular coordinate system to be formed together with the y axis and the z axis.

(Configuration of Antenna Circuit Board 11)

Figure 2:
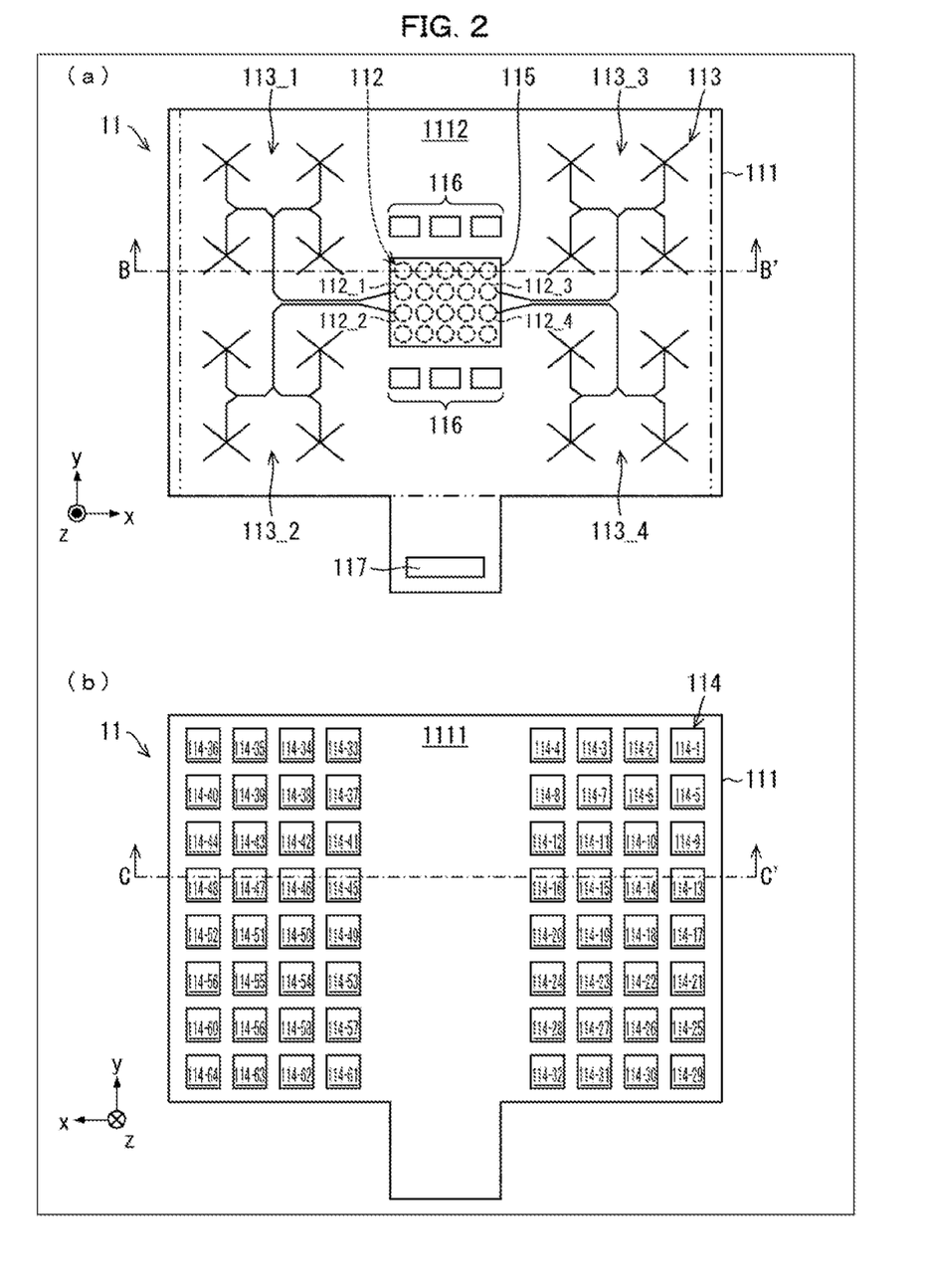

(a) of FIG. 2 is a plan view of the antenna circuit board 11 on the side of the principal surface 1112. (b) of FIG. 2 is a plan view of the antenna circuit board 11 on the side of the principal surface 1111. The principal surfaces 1111 and 1112 correspond respectively to the first and second principal surfaces recited in the claims. The term "principal surfaces" refers to those two of the six surfaces defining a member in the shape of a rectangular parallelepiped which have the largest area. The description below also uses the term "front surface 1112" to refer to the principal surface 1112 of the antenna circuit board 11 and the term "back surface 1111" to refer to the principal surface 1111.

(a) of FIG. 2 shows straight line BB' as an extension of the line of intersection of the cross section illustrated in (b) of FIG. 1 and the front surface 1112. (b) of FIG. 2 shows straight line CC' as an extension of the line of intersection of the cross section illustrated in (b) of FIG. 1 and the back surface 1111. Thus, although (a) of FIG. 1 shows only straight line AA', straight line BB' and straight line CC' coincide with straight line AA' in (a) of FIG. 1.

The antenna circuit board 11 includes a substrate 111, an input and output terminal group 112, a feed line group 113, an antenna element group 114, an integrated circuit 115, a part group 116, and a connector 117.

The substrate 111 is a plate-shaped member made of a flexible material. The material of the substrate 111 is preferably, for example, (i) a polyimide resin, (ii) a liquid crystal polymer, or (iii) a composite material including at least either a polyimide resin or a liquid crystal polymer. Other examples of the material of the substrate 111 include a polyphenylene ether (PPE)/polyphenylene oxide (PPO) resin, a polytetrafluoroethylen (PTFE) resin, and a hydrocarbon resin. The substrate 111 of the present embodiment is made of a liquid crystal polymer.

As illustrated in (a) of FIG. 2, the substrate 111 has principal surfaces each in the shape of a combination of a large rectangle and a small rectangle. In other words, the substrate 111 has principal surfaces each shaped such that a small rectangle is drawn out from a central portion of that long side of a large rectangle which is on the side of the y-axis negative direction.

The region of the large rectangle of the substrate 111 on the front surface 1112 is provided with the input and output terminal group 112, the feed line group 113, the integrated circuit 115, and the part group 116. The region of the large rectangle on the back surface 1111 is provided with the antenna element group 114. The small rectangle of the substrate 111 on the front surface 1112 is provided with the connector 117.

As illustrated in (b) of FIG. 1, the substrate 111 contains vias 111*a* that allow ends of the feed line group 113 on the front surface 1112 to be electrically connected to the antenna element group 114 on the back surface 1111.

The vias 111*a* are each a conductor post formed by filling, with a conductor, a through hole extending from the front surface 1112 of the substrate to the back surface 1111 thereof. The substrate 111 contains 64 vias 111*a* in correspondence with the number of antenna elements included in the antenna element group 114.

The input and output terminal group 112 includes a plurality of (20 in the present embodiment) electrode pads 112_1 to 112_20 on the front surface 1112 of the substrate 111. (a) of FIG. 2 shows only four electrode pads 112_1, 112_2, 112_3, and 112_4 (described later) and omits electrode pads 112_5 to 112_20.

The four electrode pads 112_1, 112_2, 112_3, and 112_4 are connected to the feed line group 113 (described later).

The electrode pads 112_5 to 112_20 are each either connected to one of the part group 116 via a signal line (not shown in (a) of FIG. 2) or not connected to any part (that is, unused). (a) of FIG. 2 illustrates an example case in which the input and output terminal group 112 includes 20 electrode pads. The number of electrode pads may, however, be any number. (a) of FIG. 2 illustrates an example case in which four electrode pads 112_1, 112_2, 112_3, and 112_4 among the 20 electrode pads are connected to the feed line group 113. The number of electrode pads connected to the feed line group 113 may, however, be any number.

The antenna element group 114 includes m antenna elements 114_j. m represents an integer of 1 or more. j represents an integer of not less than 1 and not more than m. (b) of FIG. 2 illustrates an example case in which m (that is, the number of antenna elements 114_j) is 64. m may, however, be any number.

The integrated circuit 115 includes (i) a processor configured to process a radio frequency (RF) signal (which corresponds to the "electromagnetic wave" recited in the claims) that the wireless communication module 1 transmits and receives and (ii) a memory. Specifically, the integrated circuit 115 includes (i) a transmission circuit configured to modulate, into a radio frequency (RF) signal, a baseband signal supplied from an external device (that is, a device other than the wireless communication module 1) via the connector 117 and (ii) a reception circuit configured to demodulate, into a baseband signal, a RF signal supplied from the antenna element group 114. The integrated circuit 115 of the present embodiment modulates a RF signal in the E band (that is, a band of not less than 70 GHz and not more than 80 GHz). The band is not limited to the E band, and may be selected as appropriate according to the purpose of use of the wireless communication module 1.

The integrated circuit 115 includes a ball grid array (BGA) 115a. The BGA 115a includes a plurality of (20 in the present embodiment) solder balls. The BGA 115a includes solder balls in a number equal to the number of electrode pads 121_1 to 112_20 included in the input and output terminal group 112.

The solder balls included in the BGA 115a are soldered respectively to the electrode pads 112_1 to 112_20 so that the integrated circuit 115 is mounted on the front surface 1112 of the substrate 111.

The present embodiment uses the BGA 115a to mount the integrated circuit 115 on the substrate 111. How the integrated circuit 115 is mounted on the substrate 111 is, however, not limited to using a BGA. The integrated circuit 115 may be mounted on the substrate 111 with use of an existing technique selected as appropriate.

The feed line group 113 includes four feed lines 113_1 to 113_4. The feed lines 113_1 to 113_4 each include a combination of a plurality of belt-shaped conductors on the front surface 1112. The substrate 111 contains a ground layer (not shown in (a) of FIG. 2) in an inner layer. The ground layer and the feed lines 113_1 to 113_4 form a microstrip line.

The feed line 113_1 electrically connects the electrode pad 112_1 to each of antenna elements 114_33 to 114_48 via a via 111a. The feed line 113_2 electrically connects the electrode pad 112_2 to each of antenna elements 114_49 to 114_64 via a via 111a. The feed line 113_3 electrically connects the electrode pad 112_3 to each of antenna elements 114_1 to 114_16 via a via 111a. The feed line 113_4 electrically connects the electrode pad 112_4 to each of antenna elements 114_17 to 114_32 via a via 111a.

The feed line 113_1 includes five 1×4 branching portions. In view of the feed line 113_1 in a direction from the electrode pad 121_1 to the end of the feed line 113_1, the feed line 113_1 as a single belt-shaped conductor is branched into four belt-shaped conductors through a 1×4 branching portion. The four belt-shaped conductors as branched each have another 1×4 branching portion. This means that the feed line 113_1 as a single belt-shaped conductor is branched eventually into 16 belt-shaped conductors. The 16 belt-shaped conductors as branched above each have an end electrically connected to a corresponding one of the 16 antenna elements 114_33 to 114_48 via a via 111a (see (b) of FIG. 1).

The feed line 113_1 is arranged such that the distance between the electrode pad 112_1 and the end of each of the above-described 16 belt-shaped conductors is equal to the distance between the electrode pad 112_1 and the end of any other of the 16 belt-shaped conductors. The vias 111a connected respectively to the respective ends of the 16 belt-shaped conductors are equal to one another in length. The wireless communication module 1 is thus arranged such that the distance between the electrode pad 112_1 and each of the antenna elements 114_33 to 114_48 is equal to the distance between the electrode pad 112_1 and any other of the antenna elements 114_33 to 114_48. The feed line 113_1 is, in other words, arranged as an equal-length line.

The feed lines 113_2 to 113_4 are arranged similarly to the feed line 113_1.

In a case where, for instance, the wireless communication module 1 is to transmit a RF signal, (i) a RF signal into which the integrated circuit 115 has modulated a baseband signal is fed via the feed lines 113_1 to 113_4 and the vias 111a to each of the antenna elements 114_1 to 114_64, and (ii) the antenna elements 114_1 to 114_64 each transmit the RF signal. In a case where, for instance, the wireless communication module 1 is to receive a RF signal, (i) a RF signal that the antenna elements 1141 to 114_64 have received is fed via the vias 11a and the feed lines 113_1 to 113_4 to the integrated circuit 115, and (ii) the integrated circuit 115 demodulates the RF signal into a baseband signal.

There is no limit to (i) the number of antenna elements included in the antenna element group 114 included in the wireless communication module 1, (ii) the number of feed lines included in the feed line group 113, or (iii) the manner in which the feed lines included in the feed line group 113 are branched. Those numbers and manner may be selected as appropriate.

The part group 116 includes an electronic component such as a resistor, a capacitor, and an oscillator.

The connector 117 connects the wireless communication module 1 to an external device (that is, a device other than the wireless communication module 1). Such an external device includes a connector that can be paired with the connector 117. Fitting the connector 117 with the paired connector connects the wireless communication module 1 to the external device. This allows a baseband signal to be transmitted and received between the wireless communication module 1 and the external device.

(Configuration of Support 12)

As illustrated in (a) and (b) of FIG. 1, the support 12 includes a first holding section 121, a second holding section 122, and a joining section 123. The support 12 is made of a material having a good heat-conducting property. The material of the support 12 is preferably, for example, a metal. The material is more preferably a metal having a particularly good heat-conducting property (such as copper and aluminum). Other examples of the material of the support 12 include carbon graphite, aluminum nitride, and silicon carbide. The support 12 of the present embodiment is made of aluminum.

The first holding section 121, the second holding section 122, and the joining section 123 are each a plate-shaped member. As illustrated in (a) of FIG. 1, the joining section 123 is oriented to have principal surfaces each on the xy plane. As illustrated in (b) of FIG. 1, the first holding section 121 and the second holding section 122 are each oriented to have principal surfaces each crossing the xy plane. The present embodiment is arranged such that the first holding section 121 and the second holding section 122 each have principal surfaces each orthogonal to the principal surfaces of the joining section 123.

The first holding section 121, the second holding section 122, and the joining section 123 are joined with one another in such a manner that the support 12 has a U-shaped cross section (if expressed with an alphabetical character) as described above. In other words, the joining section 123 is present between the first holding section 121 and the second holding section 122 to join the first holding section 121 and the second holding section 122 with each other. That joining portion at which the first holding section 121 and the joining section 123 are joined with one another, a portion near the joining portion, that joining portion at which the second holding section 122 and the joining section 123 are joined with one another, and a portion near the joining portion may each be angled as illustrated in (b) of FIG. 1 or rounded.

There is no limit to how the first holding section 121, the second holding section 122, and the joining section 123 are joined with one another. The first holding section 121, the second holding section 122, and the joining section 123 may be, for example, welded (for example, soldered), bolted, or bonded with use of an adhesive. The first holding section 121 and the joining section 123 are preferably joined with each other by a method that ensures high heat conduction between the first holding section 121 and the joining section 123. A similar explanation applies also to how the second holding section 122 and the joining section 123 are joined with each other.

The support 12 is joined with the substrate 111 in such a manner that the respective end surfaces of the first holding section 121 and the second holding section 122 which end surfaces are on the side of the z-axis negative direction are in contact with the front surface 1112 of the substrate 111. The support 12 is, in other words, joined with the substrate 111 in such a manner that the joining section 123 has a principal surface facing the front surface 1112 and that the joining section 123 covers the front surface 1112. The joining section 123 thus has principal surfaces each having a size equivalent to the size of the large rectangle included in each of the principal surfaces of the substrate 111.

There is no limit to how the first holding section 121 and the substrate 111 are joined with each other or how the second holding section 122 and the substrate 111 are joined with each other. The first holding section 121 and the substrate 111 may be, for example, bolted or bonded with use of an adhesive. A similar explanation applies also to how the second holding section 122 and the substrate 111 are joined with each other.

The wireless communication module 1 is arranged such that the first holding section 121 holds the antenna circuit board 11 by being in contact with one of the pair of short sides thereof (that is, the short side on the side of the x-axis negative direction). Similarly, the wireless communication module 1 is arranged such that the second holding section 122 holds the antenna circuit board 11 by being in contact with the other of the pair of short sides (that is, the short side on the side of the x-axis positive direction). The pair of short sides correspond to the "pair of opposite sides" recited in the claims.

Specifically, the first holding section 121 and the second holding section 122 each have rectangular principal surfaces. The principal surfaces of each of the first holding section 121 and the second holding section 122 each have long sides that are equivalent (equal in the present embodiment) in length to the short sides of the antenna circuit board 11 at which the antenna circuit board 11 is held.

The principal surfaces of each of the first holding section 121 and the second holding section 122 each have short sides having a length that is not smaller than the combined value of (i) a distance corresponding to a single wavelength (corresponding to the "electromagnetic wave" recited in the claims) of a RF signal transmitted and received with use of the antenna circuit board 11 and (ii) the thickness of the joining section 123. As a result, that principal surface of the joining section 123 which is on the side of the z-axis negative direction (that is, that principal surface facing the front surface 1112 of the substrate 111) is separated from the front surface 1112 of the substrate 111 by not smaller than the distance corresponding to a single wavelength of the above RF signal.

That principal surface of the joining section 123 which faces the front surface 1112 of the substrate 111 is preferably in contact with the upper surface of the integrated circuit 115. The upper surface of the integrated circuit 115 is that principal surface of the integrated circuit 115 which is opposite to that principal surface of the integrated circuit 115 on which the BGA 115$a$ is present (that is, that principal surface of the integrated circuit 115 on the side of the z-axis positive direction). The joining section 123, via the surface of contact with the integrated circuit 115, draws heat generated by the integrated circuit 115. The heat drawn by the joining section 123 from the integrated circuit 115 is diffused inside the joining section 123 and released into the air via the two principal surfaces of the joining section 123.

That principal surface of the joining section 123 which faces the front surface 1112 of the substrate 111 and the upper surface of the integrated circuit 115 may be in direct contact with each other, but are preferably in indirect contact with each other via a heat-conducting paste or heat-conducting sheet. A heat-conducting paste or heat-conducting sheet between the joining section 123 and the integrated circuit 115 improves heat conduction between the joining section 123 and the integrated circuit 115.

Assuming that the combined value of (i) the height of the integrated circuit 115 including the BGA 115$a$ and (ii) the height of the input and output terminal group 112 is not smaller than the distance corresponding to a single wavelength of the above RF signal, the first holding section 121 and the second holding section 122 each desirably have principal surfaces each having short sides equal to the value obtained by subtracting the thickness of the joining section 123 from the above combined value. This allows that principal surface of the joining section 123 which is on the side of the z-axis negative direction to be in contact with the upper surface of the integrated circuit 115.

Assuming that the combined value of (i) the height of the integrated circuit 115 including the BGA 115$a$ and (ii) the height of the input and output terminal group 112 is less than a distance corresponding to a single wavelength of the above RF signal, it is preferable that the first holding section 121 and the second holding section 122 each have short sides having a length that is not smaller than the combined value of (i) the distance corresponding to a single wavelength of the above RF signal and (ii) the thickness of the joining section 123 and that the heat-conducting paste or heat-conducting sheet is present in the gap between the integrated circuit 115 and the joining section 123. This arrangement allows the above gap to be filled without impairing heat conduction between the integrated circuit 115 and the support 12.

The support 12 of the present embodiment is formed by joining the first holding section 121, the second holding section 122, and the joining section 123 each as a plate-shaped member in such a manner as to have a U-shaped cross section. The support 12 may, however, alternatively be formed by bending a single plate-shaped member at regions including opposite sides (opposite end portions) so that the plate-shaped member has a U-shaped cross section. In this case, the opposite end portions as bent serve respectively as the first holding section 121 and the second holding section 122, and that portion between the opposite end portions serves as the joining section 123.

(Effects of Wireless Communication Module 1)

The wireless communication module 1 is arranged as above such that the support 12 holds the antenna circuit board 11 by being in contact with a pair of opposite sides thereof. The wireless communication module 1 is thus capable of keeping the antenna circuit board 11 flat even in a case where the antenna circuit board 11 is made of a flexible material. The wireless communication module 1 is, as a result, capable of preventing radiation characteristics from being changed by deformation of the antenna circuit board 11.

The wireless communication module 1 is also arranged such that the support 12 is separated from the antenna circuit board 11 by not smaller than a predetermined distance. This prevents the support 12 from becoming excessively close to the feed line group 113. The wireless communication module 1 is thus capable of preventing radiation characteristics from being degraded at the antenna element group 114, and allows for desired radiation characteristics intended during a design step.

As described above, even in a case where the wireless communication module 1 includes an antenna circuit board 11 made of a flexible material, the support 12 serves to prevent deformation of the antenna circuit board 11 (more specifically, the substrate 111) and then prevent a gain decrease. The wireless communication module 1 thus has desired radiation characteristics that are stable with respect to heat.

The wireless communication module 1 is arranged such that the support 12 and the integrated circuit 115 are in contact with each other.

The above arrangement allows the support 12 to draw, from the integrated circuit 115, heat generated by the integrated circuit 115 and diffuse the heat. Thus, even in a case where the integrated circuit 115 generates a large amount of heat (heat generation amount), the wireless communication module 1 is capable of reducing the amount of heat transmitted from the integrated circuit 115 to the antenna circuit board 11 and thus has radiation characteristics that are more stable with respect to heat.

The present embodiment is arranged such that the feed line group 113 is present on the front surface 1112 of the antenna circuit board 11.

The above arrangement includes no dielectric on one side (that is, on the side of the z-axis positive direction) of the feed line group 113. Thus, the feed line group 113 is, on one side, covered with air, which has only a small dielectric loss. As a result, in comparison to an antenna circuit board including feed lines inside a dielectric as illustrated in FIGS. 1 and 2 of Patent Literature 1, the wireless communication module 1 significantly reduces the risk of a potential loss at the feed line group 113.

The wireless communication module 1 includes an antenna circuit board 11 including a substrate 111 made of a liquid crystal polymer. This arrangement can, even in a case where the antenna circuit board 11 is used to transmit and receive an RF signal within a high-frequency band such as the E band, reduce a loss of electric power fed from the integrated circuit 115 to the antenna element group 114 via the feed line group 113. Examples of a material with a small loss include a polyimide resin and a composite material composed of at least one of a polyimide resin and a liquid crystal polymer, in addition to a liquid crystal polymer.

[Variation 1]

Figure 3:
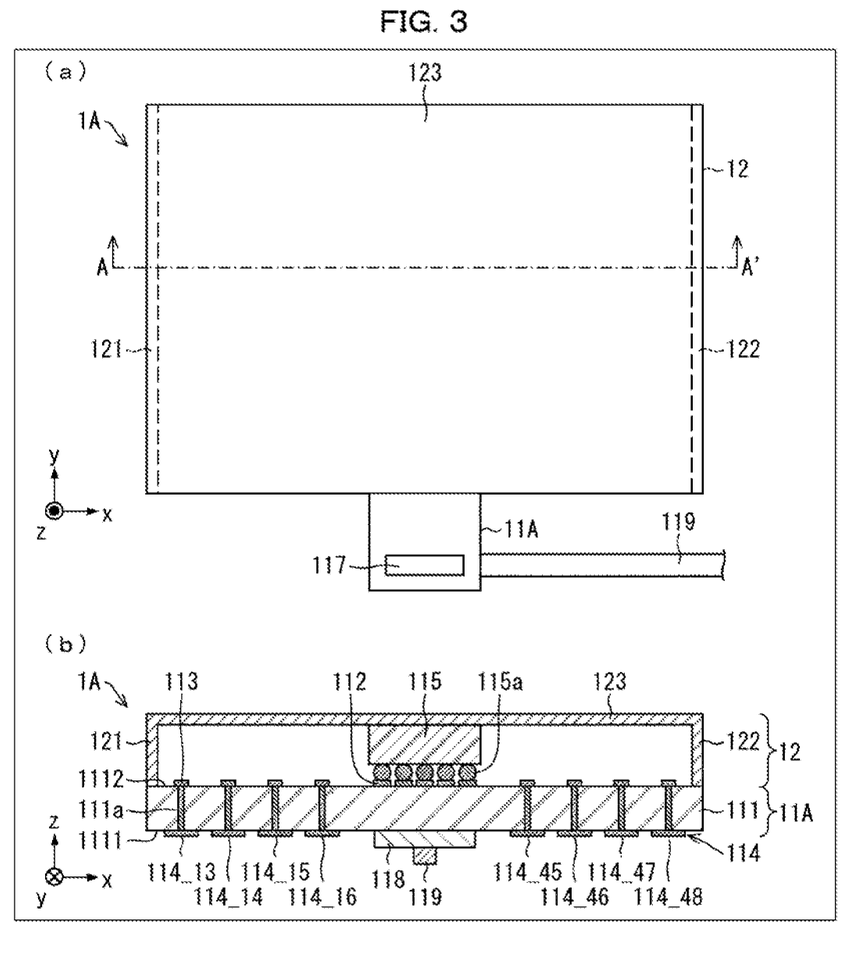
Figure 4:
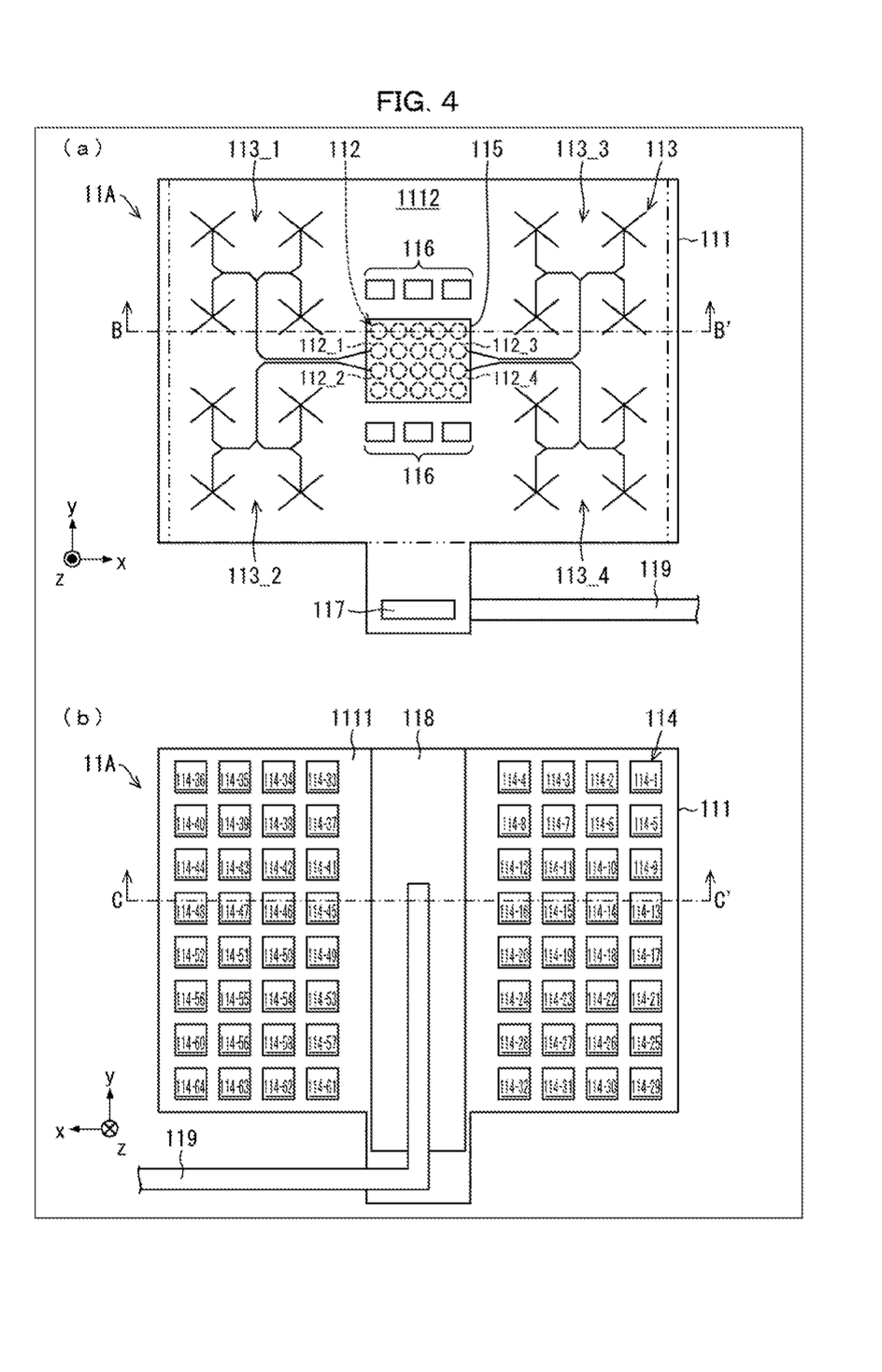

The wireless communication module 1 illustrated in FIG. 1 may be varied so that the antenna element group 114 has radiation characteristics that are even more stable with respect to heat. Variation 1 of the wireless communication module 1 is a wireless communication module 1A, which is described below with reference to FIGS. 3 and 4. (a) of FIG. 3 is a plan view of the wireless communication module 1A. (b) of FIG. 3 is a cross-sectional view of the wireless communication module 1A, the cross section (i) being taken along straight line AA' shown in (a) of FIG. 3 and (ii) extending in a direction orthogonal to a front surface 1112 and back surface 1111 of an antenna circuit board 11A. (a) of FIG. 4 is a plan view of the antenna circuit board 11A (which is included in the wireless communication module 1A) on the side of the front surface 1112. (b) of FIG. 4 is a plan view of the antenna circuit board 11A on the side of the back surface 1111. (a) of FIG. 4 shows straight line BB', which is similar to straight line BB' shown in (a) of FIG. 2. (b) of FIG. 4 shows straight line CC', which is similar to straight line CC' shown in (b) of FIG. 2. The coordinate system in each of FIGS. 3 and 4 is similar to that in each of FIGS. 1 and 2.

(Configuration of Antenna Circuit Board 11A)

As illustrated in (a) and (b) of FIG. 3, the wireless communication module 1A is produced by combining the antenna circuit board 11 of the wireless communication module 1 with a heat diffusing plate 118 and a heat pipe 119. The description of the present variation uses the term "antenna circuit board 11A" to refer to an antenna circuit board varied from the antenna circuit board 11 of the wireless communication module 1.

The heat diffusing plate 118 is a plate-shaped member made of a material having a good heat-conducting property. The material of the heat diffusing plate 118 is preferably, for example, a metal. The material is more preferably a metal having a particularly good heat-conducting property (such as copper and aluminum). The heat diffusing plate 118 of the present embodiment is made of aluminum.

The heat diffusing plate 118 is present in a region of the back surface 1111 of the substrate 111 in which region the antenna element group 114 is absent and which region coincides with the integrated circuit 115 in a plan view of the antenna circuit board 11A. The heat diffusing plate 118 draws, via the substrate 111, heat generated by the integrated circuit 115 (which is mounted on the front surface 1112) and diffuses the heat.

The heat pipe 119 is a bar-shaped member made of a material having a good heat-conducting property. The material of the heat pipe 119 is preferably, for example, a metal.

The material is more preferably a metal having a particularly good heat-conducting property (such as copper and aluminum). The heat pipe 119 of the present embodiment is made of copper.

The heat pipe 119 has a portion including a first end thereof which portion is in contact with a surface of the heat diffusing plate 118. The heat pipe 119 has a second end (not shown in (a) of FIG. 4) in contact with a metal member outside the wireless communication module 1A.

The heat pipe 119 (which is arranged as above) draws, at the first end, heat drawn by the heat diffusing plate 118 from the integrated circuit 115 and transmits the heat to the metal member at the second end.

The heat pipe 119 may be hollow to allow cooling water to circulate inside the heat pipe 119.

(Further Effects of Antenna Circuit Board 11A)

As described above, the wireless communication module 1A additionally includes a heat diffusing plate 118. This arrangement allows the heat diffusing plate 118 to draw heat from the integrated circuit 115 and diffuse the heat, and thereby reduces the amount of heat transmitted from the integrated circuit 115 to the antenna circuit board 11A. Thus, even in a case where the integrated circuit 115 generates a large amount of heat (heat generation amount), the wireless communication module 1A has radiation characteristics that are more stable with respect to heat.

The wireless communication module 1A additionally includes a heat pipe 119. With this arrangement, the heat pipe 119 allows heat drawn by the heat diffusing plate 118 from the integrated circuit 115 to be efficiently released from the heat diffusing plate 118 (that is, from the wireless communication module 1A). Thus, even in a case where the integrated circuit 115 generates a large amount of heat (heat generation amount), the wireless communication module 1A has radiation characteristics that are even more stable with respect to heat.

[Variation 2]

Figure 5:
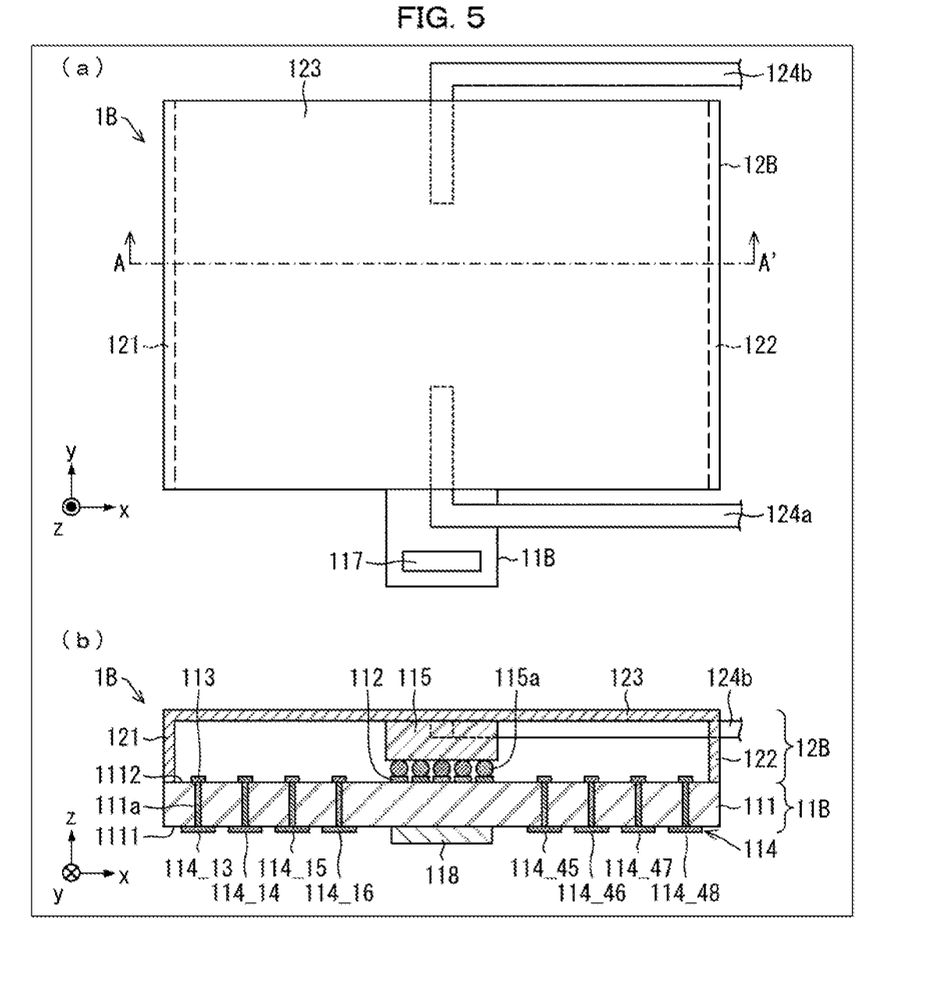

The wireless communication module 1 illustrated in FIG. 1 may be varied so that the antenna element group 114 has radiation characteristics that are even more stable with respect to heat. Variation 2 of the wireless communication module 1 is a wireless communication module 1B, which is described below with reference to FIG. 5. (a) of FIG. 5 is a plan view of the wireless communication module 1B. (b) of FIG. 5 is a cross-sectional view of the wireless communication module 1B, the cross section (i) being taken along straight line AA' shown in (a) of FIG. 5 and (ii) extending in a direction orthogonal to a front surface 1112 and back surface 1111 of an antenna circuit board 11B. The coordinate system in FIG. 5 is similar to that in each of FIGS. 1 and 2.

As illustrated in (a) and (b) of FIG. 5, the wireless communication module 1B is produced by replacing the support 12 of the wireless communication module 1 with a differently shaped support 12B and then combining the antenna circuit board 11 of the wireless communication module 1 with a heat diffusing plate 118. The description of the present variation uses the term "antenna circuit board 11B" to refer to an antenna circuit board varied from the antenna circuit board 11 of the wireless communication module 1 and the term "support 12B" to refer to a support shaped differently from the support 12 of the wireless communication module 1.

(Configuration of Antenna Circuit Board 11B)

As described above, the antenna circuit board 11B is produced by combining the antenna circuit board 11 with a heat diffusing plate 118. Stated differently, the antenna circuit board 11B is produced by removing the heat pipe 119 from the antenna circuit board 11A. The description of the present variation thus does not deal with the antenna circuit board 11B.

The heat diffusing plate 118 is capable of drawing heat from the integrated circuit 115 through the substrate 111 and diffusing the heat, and thereby reduces the amount of heat transmitted from the integrated circuit 115 to the antenna circuit board 11B. The wireless communication module 1B thus has radiation characteristics that are more stable with respect to heat.

(Configuration of Support 12B)

The support 12B is produced by combining the support 12 with a heat pipe 124a and a heat pipe 124b.

The heat pipe 124a and the heat pipe 124b are each arranged similarly to the heat pipe 119 described for Variation 1. The description of the present variation thus deals with how the heat pipe 124a and the heat pipe 124b are placed. When the support 12B is viewed from above on the side of a principal surface thereof (see (a) of FIG. 5), the heat pipe 124a and the heat pipe 124b are placed on a surface of the joining section 123 in line symmetry to each other with respect to, as an axis of symmetry, a straight line that extends along the x-axis direction and that divides the principal surface of the support 12B into two equal parts. The description of the present variation thus deals with how the heat pipe 124a is placed and does not deal with how the heat pipe 124b is placed.

The heat pipe 124a is present (i) along that surface of the joining section 123 (which is included in the support 12B) which is that principal surface on the side of the z-axis negative direction (that is, that principal surface which is opposite to the front surface 1112 of the antenna circuit board 11B) and (ii) in contact with that principal surface on the side of the z-axis negative direction. More specifically, the heat pipe 124a is present in a region of that principal surface on the side of the z-axis negative direction which region does not coincide with the feed line group 113.

The above arrangement prevents the heat pipe 124a from being close to the feed line group 113, and thereby prevents the radiation characteristics of the antenna element group 114 from being degraded as compared with those intended during a design step.

For the wireless communication module 1B, that region of the principal surface on the side of the z-axis negative direction which region does not coincide with the feed line group 113 is a region that combines (i) a contact region in which the support 12B is in contact with the integrated circuit 115 with (ii) a region as an extension of the contact region in the y-axis positive direction and a region as an extension of the contact region in the y-axis negative direction. The heat pipe 124a has a first end placed in the region as an extension of the contact region in the y-axis negative direction. The heat pipe 124a has a second end (not shown in (a) of FIG. 5) in contact with a metal member outside the wireless communication module 1B.

The heat pipe 124a is capable of causing heat drawn by the support 12B from the integrated circuit 115 to be efficiently released from the support 12B. Thus, even in a case where the integrated circuit 115 generates a large amount of heat (heat generation amount), the wireless communication module 1B has radiation characteristics that are even more stable with respect to heat.

Embodiment 2

Figure 6:
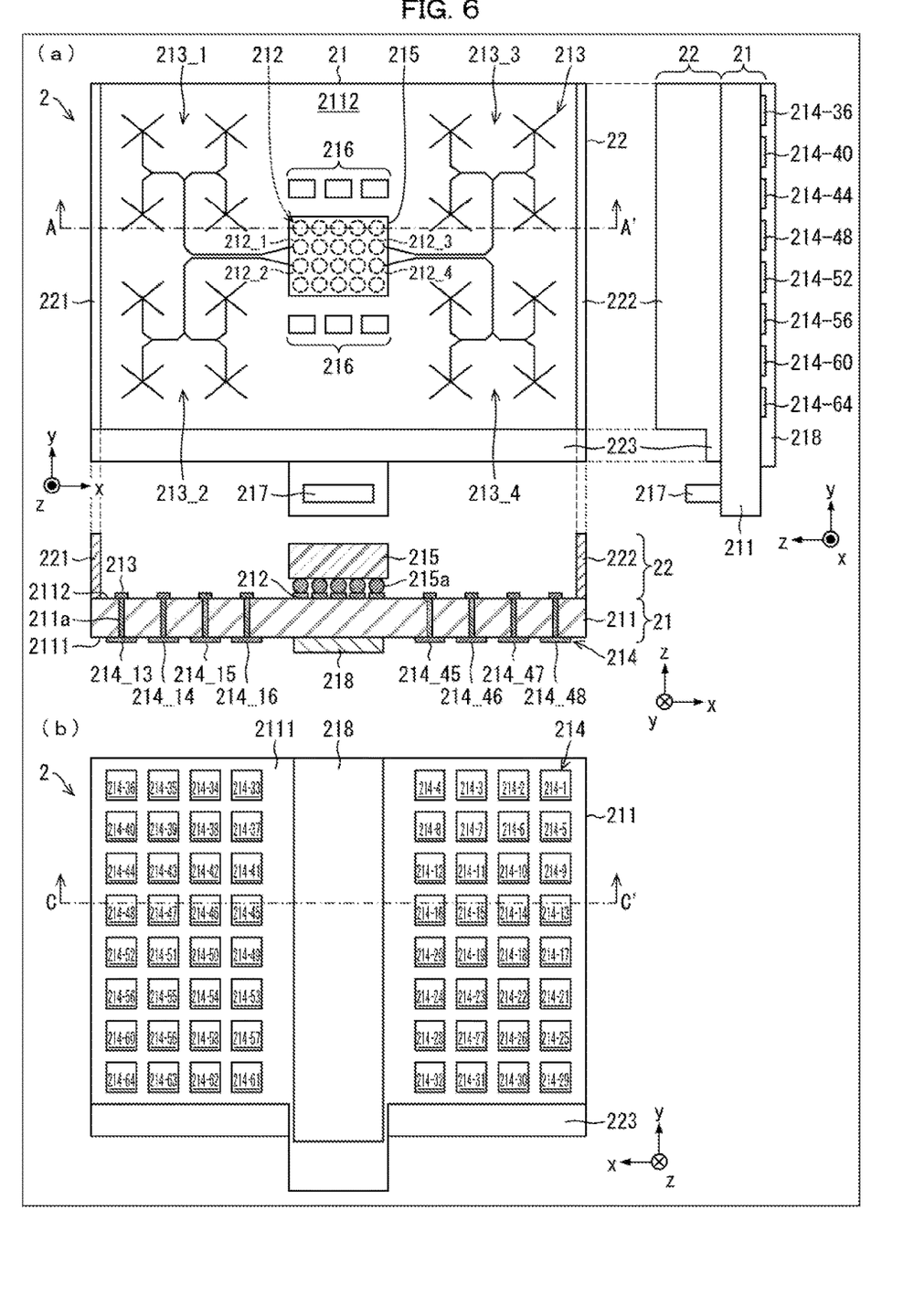

The following description will discuss Embodiment 2 of the present invention in detail with reference to FIG. 6. (a)

of FIG. 6 is a trihedral drawing of a wireless communication module 2 in accordance with Embodiment 2 of the present invention. (b) of FIG. 6 is a plan view of the wireless communication module 2 on the side of a back surface thereof. The coordinate system in FIG. 6 is similar to that in each of FIGS. 1 and 2.

As illustrated in (a) and (b) of FIG. 6, the wireless communication module 2 includes an antenna circuit board 21 and a support 22.

(Configuration of Antenna Circuit Board 21)

The antenna circuit board 21 includes a substrate 211, an input and output terminal group 212, a feed line group 213, an antenna element group 214, an integrated circuit 215, a part group 216, a connector 217, and a heat diffusing plate 218. The substrate 211 contains vias 211a. The substrate 211, the vias 211a, the input and output terminal group 212, the feed line group 213, the antenna element group 214, the integrated circuit 215, the part group 216, and the connector 217 are arranged similarly to the substrate 111, the vias 11a, the input and output terminal group 112, the feed line group 113, the antenna element group 114, the integrated circuit 115, and the part group 116 for Embodiment 1. The heat diffusing plate 218 is arranged similarly to the heat diffusing plate 118 for Variation 1 of Embodiment 1.

(Configuration of Support 22)

As illustrated in (a) of FIG. 6, the support 22 includes a first holding section 221, a second holding section 222, and a joining section 223. The support 22 is made of a material having a good heat-conducting property. The support 22 is similar to the support 12 in this regard. The support 22 of the present embodiment is made of aluminum.

The first holding section 221, the second holding section 222, and the joining section 223 are each a plate-shaped member. As illustrated in (a) of FIG. 6, the joining section 223 has a long axis extending in the x-axis direction (parallel in the present embodiment). The first holding section 221 and the second holding section 222 each have a long axis extending in the y-axis direction (parallel in the present embodiment). The present embodiment is arranged such that the first holding section 221 and the second holding section 222 each have a long axis orthogonal to the long axis of the joining section 223.

As described above, in a case where the antenna circuit board 21 is viewed from above on the side of the front surface 2112, the support 22 is arranged such that the first holding section 221, the second holding section 222, and the joining section 223 are joined with one another in such a manner that the support 22 has a U shape (if expressed with an alphabetical character) in a plan view. In other words, the joining section 223 is present between the first holding section 221 and the second holding section 222 to join the first holding section 221 and the second holding section 222 with each other. The joining section 223 of the support 22 thus does not face the front surface 2112 of the antenna circuit board 21. That joining portion at which the first holding section 221 and the joining section 223 are joined with one another, a portion near the joining portion, that joining portion at which the second holding section 222 and the joining section 223 are joined with one another, and a portion near the joining portion may each be angled as illustrated in (a) of FIG. 6 or rounded.

How the first holding section 221, the second holding section 222, and the joining section 223 are joined with one another is similar to how the first holding section 121, the second holding section 122, and the joining section 123 are joined with one another.

The support 22 is joined with the substrate 211 in such a manner that the respective end surfaces of the first holding section 221, the second holding section 222, and the joining section 223 which end surfaces are on the side of the z-axis negative direction are in contact with the front surface 2112 of the substrate 211. The support 22 is, in other words, joined with the substrate 211 in such a manner as to (i) surround the substrate 211 on three side surfaces thereof and (ii) not coincide with the front surface 2112 of the substrate 211.

How the first holding section 221 and the substrate 211 are joined with each other, how the second holding section 222 and the substrate 211 are joined with each other, and how the joining section 223 and the substrate 211 are joined with each other are similar to how the first holding section 121 and the substrate 111 are joined with each other and how the second holding section 122 and the substrate 111 are joined with each other.

The wireless communication module 2 is arranged such that the first holding section 221 holds the antenna circuit board 21 by being in contact with one of the pair of short sides thereof (that is, the short side on the side of the x-axis negative direction). Similarly, the wireless communication module 2 is arranged such that the second holding section 222 holds the antenna circuit board 21 by being in contact with the other of the pair of short sides (that is, the short side on the side of the x-axis positive direction). The pair of short sides correspond to the "pair of opposite sides" recited in the claims.

The support 22 may alternatively be produced by bending a single plate-shaped member at portions including opposite ends so that the plate-shaped member has a U shape in a plan view. In this case, the bent portions including opposite ends serve respectively as the first holding section 221 and the second holding section 222, and that portion between the bent portions including opposite ends serves as the joining section 223.

(Effects of Wireless Communication Module 2)

The wireless communication module 2 is, similarly to the wireless communication module 1, capable of keeping the antenna circuit board 21 flat even in a case where the antenna circuit board 21 is made of a flexible material. The wireless communication module 2 is, as a result, capable of preventing radiation characteristics from being changed by deformation of the antenna circuit board 21.

The wireless communication module 2 is arranged such that the support 22 is joined with the substrate 211 in such a manner as to (i) surround the substrate 211 on three side surfaces thereof and (ii) not coincide with the front surface 2112 of the substrate 211. The wireless communication module 2 is thus capable of preventing radiation characteristics from being degraded at the antenna element group 214, and allows for desired radiation characteristics intended during a design step.

As described above, even in a case where the wireless communication module 2 includes an antenna circuit board 21 made of a flexible material, the support 22 serves to prevent deformation of the antenna circuit board 21 (more specifically, the substrate 211) and then prevent a gain decrease. The wireless communication module 2 thus has desired radiation characteristics that are stable with respect to heat.

The wireless communication module 2 includes a heat diffusing plate 218. This arrangement allows the heat diffusing plate 218 to, similarly to the heat diffusing plate 118, draw heat from the integrated circuit 215 through the substrate 211 and diffuse the heat. Thus, even in a case where the integrated circuit 215 generates a large amount of heat (heat generation amount), the wireless communication module 2 is capable of reducing the amount of heat transmitted from the integrated circuit 215 to the antenna circuit board 21. The wireless communication module 2 thus has radiation characteristics that are more stable with respect to heat.

[Variation 3]

Figure 7:
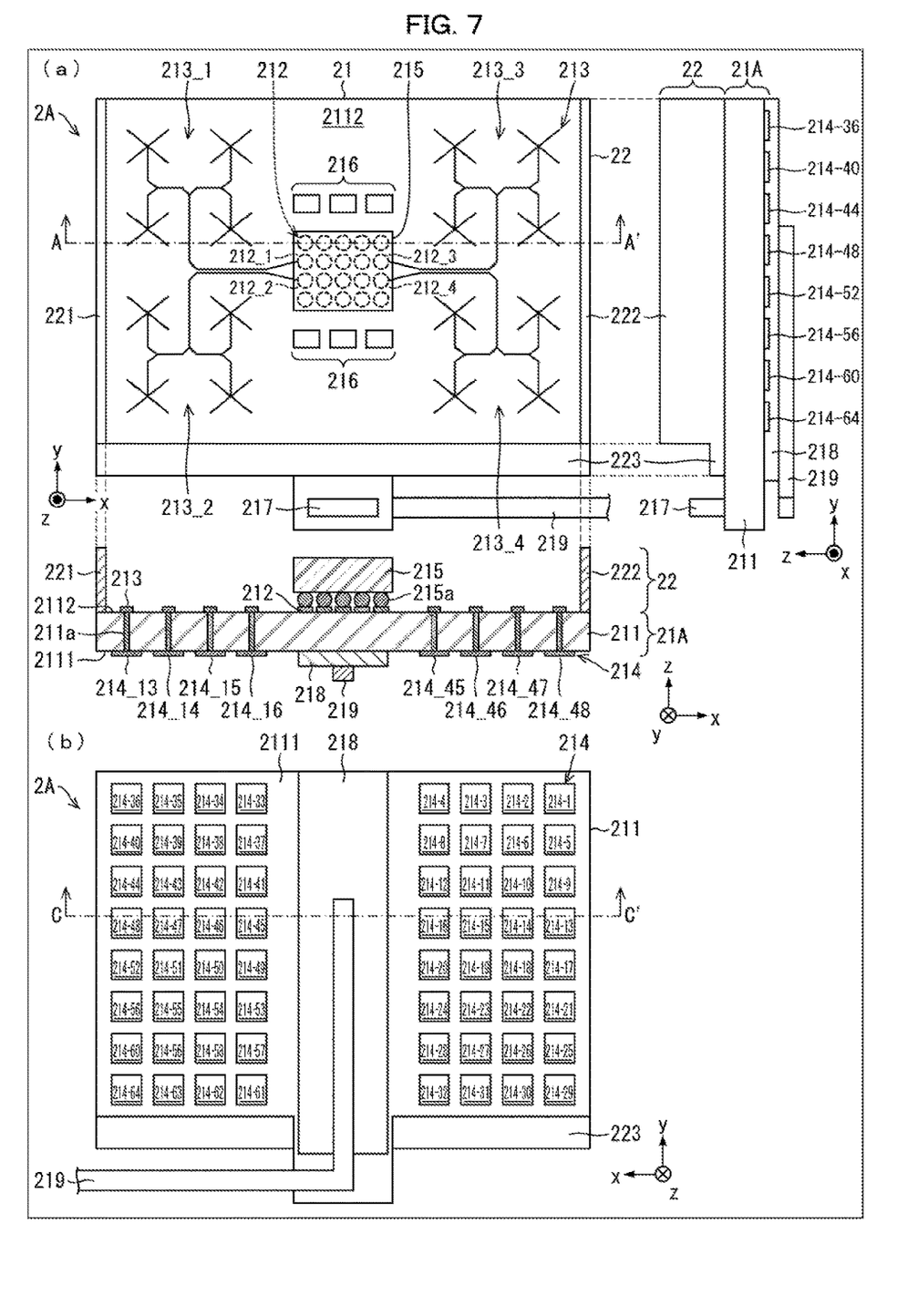

The wireless communication module 2 illustrated in FIG. 6 may be varied so that the antenna element group 214 has radiation characteristics that are even more stable with respect to heat. A variation of the wireless communication module 2 (Variation 3 of the present invention) is a wireless communication module 2A, which is described below with reference to FIG. 7. (a) of FIG. 7 is a trihedral drawing of the wireless communication module 2A. (b) of FIG. 7 is a plan view of the wireless communication module 2A on the side of a back surface thereof. The coordinate system in FIG. 7 is similar to that in each of FIGS. 1 and 2.

As illustrated in (a) and (b) of FIG. 7, the wireless communication module 2A is produced by replacing the antenna circuit board 21 of the wireless communication module 2 with an antenna circuit board 21A. Specifically, the antenna circuit board 21A is produced by combining the antenna circuit board 21 with a heat pipe 219. The heat pipe 219 is arranged identically to the heat pipe 119 illustrated in FIGS. 3 and 4.

The heat pipe 219 has a first end (not shown in (a) and (b) of FIG. 7) that is, for example, in contact with a metal member outside the wireless communication module 2A. With this arrangement, the heat pipe 219 allows heat drawn by the heat diffusing plate 218 from the integrated circuit 215 through the substrate 211 to be efficiently released from the heat diffusing plate 218 (that is, from the wireless communication module 2A). Thus, even in a case where the integrated circuit 215 generates a large amount of heat (heat generation amount), the wireless communication module 2A has radiation characteristics that are even more stable with respect to heat.

Aspects of the present invention can also be expressed as follows:

A wireless communication module (1, 1A, 1B, 2, 2A) in accordance with an embodiment of the present invention includes: an antenna circuit board (11, 11A, 11B, 21, 21A) having (i) a first principal surface (1111, 2111) on which at least one antenna element (114_1 to 114_64, 214_1 to 214_64) is provided and (ii) a second principal surface (1112, 2112) on which at least one feed line (113_1 to 113_4, 213_1 to 213_4) and an integrated circuit (115, 215) are provided, which integrated circuit (115, 215) is connected to the at least one antenna element (114_1 to 114_64, 214_1 to 214_64) via the at least one feed line (113_1 to 113_4, 213_1 to 213_4); and a support (12, 12B, 22) that holds a pair of opposite sides of the antenna circuit board (11, 11A, 11B, 21, 21A) so as to keep the antenna circuit board (11, 11A, 11B, 21, 21A) flat, the support (12, 12B, 22) being provided (i) so as to face the second principal surface (1112, 2112) of the antenna circuit board (11, 11A, 11B, 21, 21A) and so as to be away from the second principal surface (1112, 2112) of the antenna circuit board (11, 11A, 11B, 21, 21A) by a distance that is not smaller than a wavelength of an electromagnetic wave which is transmitted and received with use of the antenna circuit board (11, 11A, 11B, 21, 21A) or (ii) so as not to face the second principal surface (1112, 2112) of the antenna circuit board (11, 11A, 11B, 21, 21A).

With the above arrangement, the support holds the antenna circuit board by being in contact with the pair of opposite sides thereof. This makes it possible to keep the antenna circuit board flat even in a case where the antenna circuit board is made of a flexible material. The above arrangement thus makes it possible to prevent radiation characteristics from being changed by deformation of the antenna circuit board.

Further, the above arrangement prevents the support from becoming excessively close to the feed line in either of the cases (1) and (2). This makes it possible to prevent radiation characteristics from being degraded at the antenna element, and allows for desired radiation characteristics intended during a design step.

As described above, even in a case where the wireless communication module includes an antenna circuit board made of a flexible material, the wireless communication module prevents not only deformation of the antenna circuit board, but also degradation of radiation characteristics (for example, a gain decrease) which degradation can occur as a result of the use of a support.

A wireless communication module (1, 1A, 1B) in accordance with an embodiment of the present invention may preferably be arranged such that the support (12, 12B) faces the second principal surface (1112) of the antenna circuit board (11, 11A, 11B) and is in contact with the integrated circuit (115) so as to diffuse heat generated by the integrated circuit (115).

The above arrangement allows the support (which is in contact with the integrated circuit) to draw, from the integrated circuit, heat generated by the integrated circuit and diffuse the heat. Thus, even in a case where the integrated circuit generates a large amount of heat (heat generation amount), the wireless communication module is capable of reducing the amount of heat transmitted from the integrated circuit to the antenna circuit board and thus has radiation characteristics that are more stable with respect to heat.

A wireless communication module (1B) in accordance with an embodiment of the present invention may preferably further include a heat pipe (124a, 124b) provided on a surface of the support (12B).

The above arrangement allows the heat pipe to cause heat drawn by the support from the integrated circuit to be efficiently released from the support. The wireless communication module thus has radiation characteristics that are even more stable with respect to heat.

A wireless communication module (1A, 1B, 2, 2A) in accordance with an embodiment of the present invention may preferably further include: a heat diffusing plate (118, 218), provided in a region of the first principal surface (1111, 2111) of the antenna circuit board (11A, 11B, 21, 21A), which diffuses heat generated by the integrated circuit (115, 215), in the region where no antenna element (114_1 to 114_64, 214_1 to 214_64) is provided, the region and the integrated circuit (115, 215) overlapping each other when the antenna circuit board (11A, 11B, 21, 21A) is viewed from above.

The above arrangement allows the heat diffusing plate (which is present in a region that coincides with the integrated circuit) to draw, from the integrated circuit via the antenna circuit board, heat generated by the integrated circuit and diffuse the heat. Thus, the wireless communication module is capable of reducing the amount of heat transmitted from the integrated circuit to the antenna circuit board and thus has radiation characteristics that are more stable with respect to heat.

A wireless communication module (1A, 2A) in accordance with an embodiment of the present invention may preferably further include a heat pipe (119, 219) provided on a surface of the heat diffusing plate (118, 218).

The above arrangement allows the heat pipe to cause heat drawn by the heat diffusing plate from the integrated circuit to be efficiently released from the heat diffusing plate. The wireless communication module thus has radiation characteristics that are even more stable with respect to heat.

A wireless communication module (1, 1A, 1B, 2, 2A) in accordance with an embodiment of the present invention may preferably be arranged such that the antenna circuit board (11, 11A, 11B, 21, 21A) is a flexible antenna circuit board (11, 11A, 11B, 21, 21A) which is composed of (i) a polyimide resin, (ii) a liquid crystal polymer, or (iii) a composite material composed of at least one of a polyimide resin and a liquid crystal polymer.

The above arrangement can, even in a case where the antenna circuit board is used to transmit and receive an electromagnetic wave within a high-frequency band such as the E band, reduce a loss of electric power fed from the integrated circuit to the antenna element via the feed line.

The present invention is not limited to the embodiments, but can be altered by a skilled person in the art within the scope of the claims. The present invention also encompasses, in its technical scope, any embodiment derived by combining technical means disclosed in differing embodiments.

REFERENCE SIGNS LIST 1, 1A, 1B, 2, 2A Wireless communication module
11, 11A, 11B, 21, 21A Antenna circuit board
12, 12B, 22 Support
111, 211 Substrate
111a, 211a Via
112, 212 Input and output terminal group
112_1 to 112_20, 212_1 to 212_20 Electrode pad
113, 213 Feed line group
113_1 to 113_4, 213_1 to 213_4 Feed line
114, 214 Antenna element group
114_1 to 114_64, 214_1 to 214_64 Antenna element
115, 215 Integrated circuit
115a, 215a BGA
116, 216 Part group
117, 217 Connector
118, 218 Heat diffusing plate
119, 219 Heat pipe
121, 221 First holding section
122, 222 Second holding section
123, 223 Joining section
124a, 124b Heat pipe

The invention claimed is:

1. A wireless communication module, comprising:
an antenna circuit board having (i) a first principal surface on which at least one antenna element is provided and (ii) a second principal surface on which at least one feed line and an integrated circuit are provided, which integrated circuit is connected to the at least one antenna element via the at least one feed line; and
a support that holds a pair of opposite sides of the antenna circuit board so as to keep the antenna circuit board flat,
the support being provided so as to face the second principal surface of the antenna circuit board and so as to be away from the second principal surface of the antenna circuit board by a distance that is not smaller than a wavelength of an electromagnetic wave which is transmitted and received with use of the antenna circuit board.

2. The wireless communication module according to claim 1, wherein the support faces the second principal surface of the antenna circuit board and is in contact with the integrated circuit so as to diffuse heat generated by the integrated circuit.

3. The wireless communication module according to claim 2, further comprising:
a heat pipe provided on a surface of the support.

4. The wireless communication module according to claim 1, further comprising:
a heat diffusing plate, provided in a region of the first principal surface of the antenna circuit board, which diffuses heat generated by the integrated circuit,
in the region where no antenna element is provided, the region and the integrated circuit overlapping each other when the antenna circuit board is viewed from above.

5. The wireless communication module according to claim 4, further comprising:
a heat pipe provided on a surface of the heat diffusing plate.

6. The wireless communication module according to claim 1, wherein:
the antenna circuit board is a flexible antenna circuit board which is composed of (i) a polyimide resin, (ii) a liquid crystal polymer, or (iii) a composite material composed of at least one of a polyimide resin and a liquid crystal polymer.

7. A wireless communication module, comprising:
an antenna circuit board having (i) a first principal surface on which at least one antenna element is provided and (ii) a second principal surface on which at least one feed line and an integrated circuit are provided, which integrated circuit is connected to the at least one antenna element via the at least one feed line; and
a support that holds a pair of opposite sides of the antenna circuit board so as to keep the antenna circuit board flat,
the support being provided (i) so as to face the second principal surface of the antenna circuit board and so as to be away from the second principal surface of the antenna circuit board by a distance that is not smaller than a wavelength of an electromagnetic wave which is transmitted and received with use of the antenna circuit board or (ii) so as not to face the second principal surface of the antenna circuit board,
wherein the support faces the second principal surface of the antenna circuit board and is in contact with the integrated circuit so as to diffuse heat generated by the integrated circuit.

8. The wireless communication module according to claim 7, further comprising:
a heat pipe provided on a surface of the support.

9. The wireless communication module according to claim 7, further comprising:
a heat diffusing plate, provided in a region of the first principal surface of the antenna circuit board, which diffuses heat generated by the integrated circuit,
in the region where no antenna element is provided, the region and the integrated circuit overlapping each other when the antenna circuit board is viewed from above.

10. The wireless communication module according to claim 9, further comprising:
a heat pipe provided on a surface of the heat diffusing plate.

11. The wireless communication module according to claim 7, wherein:
the antenna circuit board is a flexible antenna circuit board which is composed of (i) a polyimide resin, (ii)

a liquid crystal polymer, or (iii) a composite material composed of at least one of a polyimide resin and a liquid crystal polymer.

* * * * *